United States Patent
Fujimoto (10) Patent No.: US 7,478,358 B2
(45) Date of Patent: Jan. 13, 2009

(54) SEMICONDUCTOR INTEGRATED CIRCUIT DEVICE

(75) Inventor: Yukihiro Fujimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 11/406,987

(22) Filed: Apr. 19, 2006

(65) Prior Publication Data

US 2006/0243955 A1    Nov. 2, 2006

(30) Foreign Application Priority Data

Apr. 19, 2005    (JP)    ............................ P2005-121388

(51) Int. Cl.
G06F 17/50    (2006.01)
(52) U.S. Cl. ....................................................... 716/17
(58) Field of Classification Search ..................... 716/17
See application file for complete search history.

(56) References Cited

U.S. PATENT DOCUMENTS

| | | | | |
|---|---|---|---|---|
| 5,124,776 A | * | 6/1992 | Tanizawa et al. | 257/204 |
| 5,737,236 A | * | 4/1998 | Maziasz et al. | 716/8 |
| 6,470,475 B2 | * | 10/2002 | Dubey | 716/1 |
| 6,477,687 B1 | * | 11/2002 | Thomas | 716/8 |
| 6,536,028 B1 | * | 3/2003 | Katsioulas et al. | 716/17 |
| 6,931,606 B1 | * | 8/2005 | Kretchmer et al. | 716/1 |
| 6,938,226 B2 | * | 8/2005 | Nguyen et al. | 716/1 |
| 2003/0208738 A1 | * | 11/2003 | Hsu et al. | 716/12 |
| 2004/0078769 A1 | | 4/2004 | Crafts | |

\* cited by examiner

*Primary Examiner*—Vuthe Siek
*Assistant Examiner*—Brandon W Bowers
(74) *Attorney, Agent, or Firm*—Sprinkle IP Law Group (57) ABSTRACT

LSI device 100 is provided with standard cell regions 10, a plurality of standard cells 20, memory blocks 11 and a plurality of memory cells 21. Standard cells 20 are equal in height "Hs" and disposed in standard cell regions 10 in a vertical direction. Memory blocks 11 are provided in contact with standard cell region 10 in a horizontal direction and memory cells 21 are disposed in memory blocks 11 in the vertical direction. Height "Hm" of memory cells 21 is equal to the height "Hs" or the height of the standard cell divided by an integer. Boundary positions of standard cells 20 neighboring each other are consistent with those of memory cells 21 neighboring each other.

9 Claims, 8 Drawing Sheets

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2005-121388, filed on Apr. 19, 2005, the entire contents of which are incorporated herein by reference.

FIELD OF THE INVENTION

This invention generally relates to a semiconductor integrated circuit device and, more particularly, to a semiconductor integrated circuit device designed in a standard cell system.

BACKGROUND OF THE INVENTION

In order to improve design accuracy and shorten a period of time for development, automatic design is carried out for a large scale semiconductor integrated circuit (LSI) device in accordance with a standard cell system disposed of predetermined height standard cells. Design rules of boundary patterns are set up for layouts of well boundaries, electric-power-supply lines, distances from the well boundaries to internal patterns, etc. to dispose standard cells closely. Since the standard cells are disposed closely, the standard cells are connected to each other and the electric power supply lines are connected to the wells as described in U.S. Patent Publication No. 2004/0078769A1, for instance.

Recently, large scale logic LSI devices for graphic processors or the like are provided with many memory blocks of small scale SRAM (static random access memory) or the like in addition to standard cell regions in which standard cells are disposed. The design of such memory blocks is customized to comply with requirements for the reduction of areas and high performances. Layout design for the memory blocks is carried our depending on pitches of the memory cells disposed in the memory blocks. In other words, since the memory blocks are different in design rules from the standard cell, space regions are provided regions between the memory blocks and the standard cells to avoid conflict of each design rule. Particularly, in the case that many small memory blocks are used, space regions are provided between memory blocks and standard cell regions, respectively, so that chip areas are increased. Alternatively, even if regions with no patterns were provided on boundary sides between standard cell regions in memory blocks to prevent troubles due to the contact by standard cells to memory blocks, chip areas should be increased eventually.

SUMMARY OF THE INVENTION

One aspect of the present invention is directed to an LSI device designed in accordance with a standard cell system which is capable of suppressing the increase of chip areas due to disposition of memory blocks.

Another aspect of the present invention is directed to an LSI device defined by (a) standard cell regions for standard cells, (b) memory cells in memory blocks and (c) boundary positions of the standard cells. The standard cells are equal in height to each other and disposed in a vertical direction in the standard cell regions. The memory blocks contact the standard cell regions while the memory cells which is equal to the height of the standard cells or which is the height of the standard cells divided by an integer are disposed in a horizontal direction. The boundary positions between neighboring ones of the standard cells are consist with those between neighboring ones of the memory cells.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

First Embodiment

Figure 1:
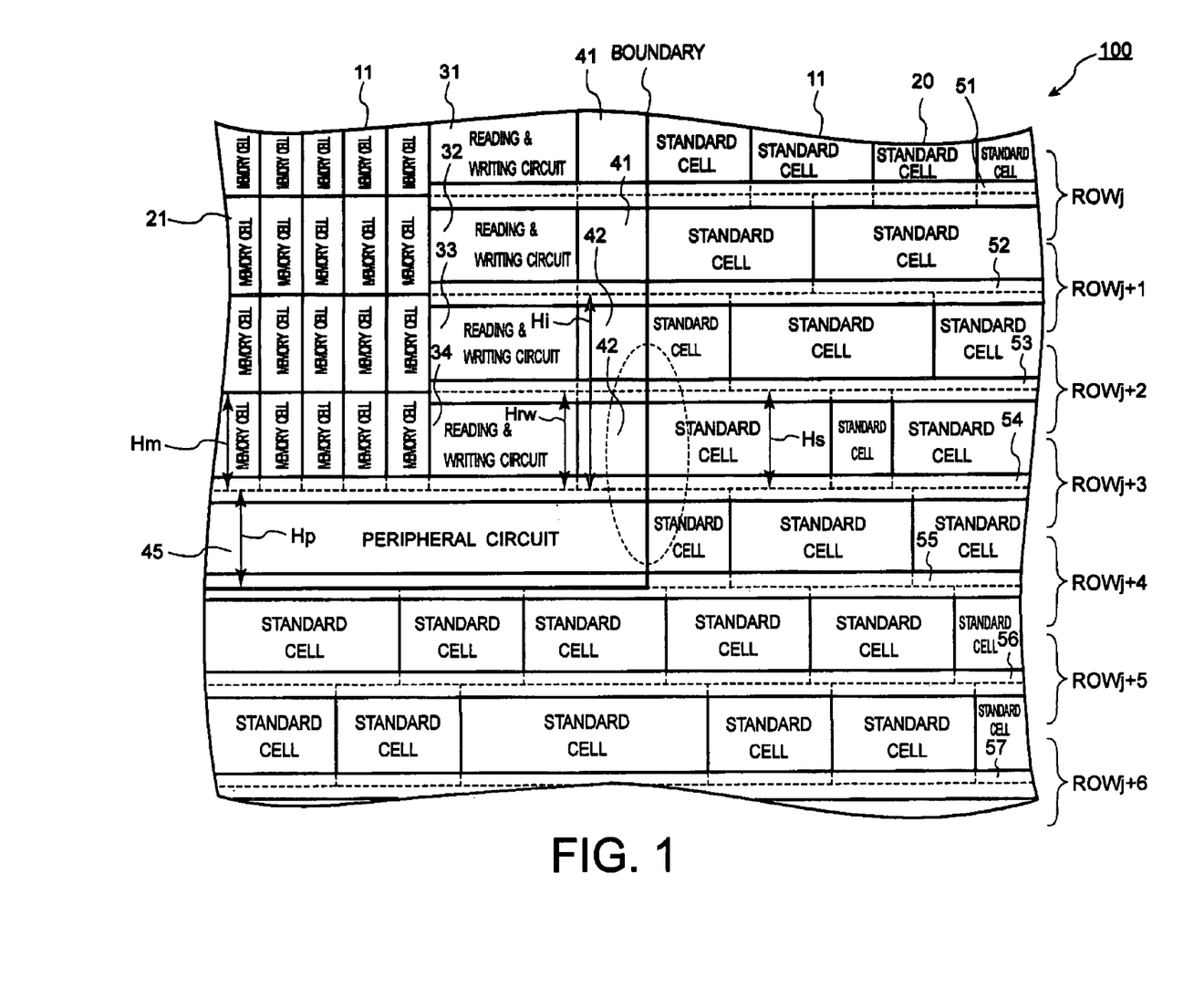
FIG. 1 is a plan view of a part of an LSI in accordance with an embodiment of the present invention (an enlarged plan view of a portion surrounded by doted lines shown in FIG. 3).

LSI device 100 of the first embodiment in accordance with the present invention is provided with standard cell region 10 and memory block 11 as shown in FIG. 1. Standard cell region 10 includes a plurality of standard cells 20 which are of equal height "Hs" and are disposed in the vertical direction in standard cell region 10. Memory block 11 includes a plurality of memory cells 21 which are in contact with standard cell region 10 and are disposed in a vertical direction while height "Hm" of memory cells 21 is equal to the height "Hs" or the height of the standard cells divided by an integer, where Hs=n×Hm, (n=integer=1, 2, 3, . . . ). Boundary positions between neighboring ones of standard cells 20 are consistent with those between neighboring ones of memory cells 21.

Figure 2:
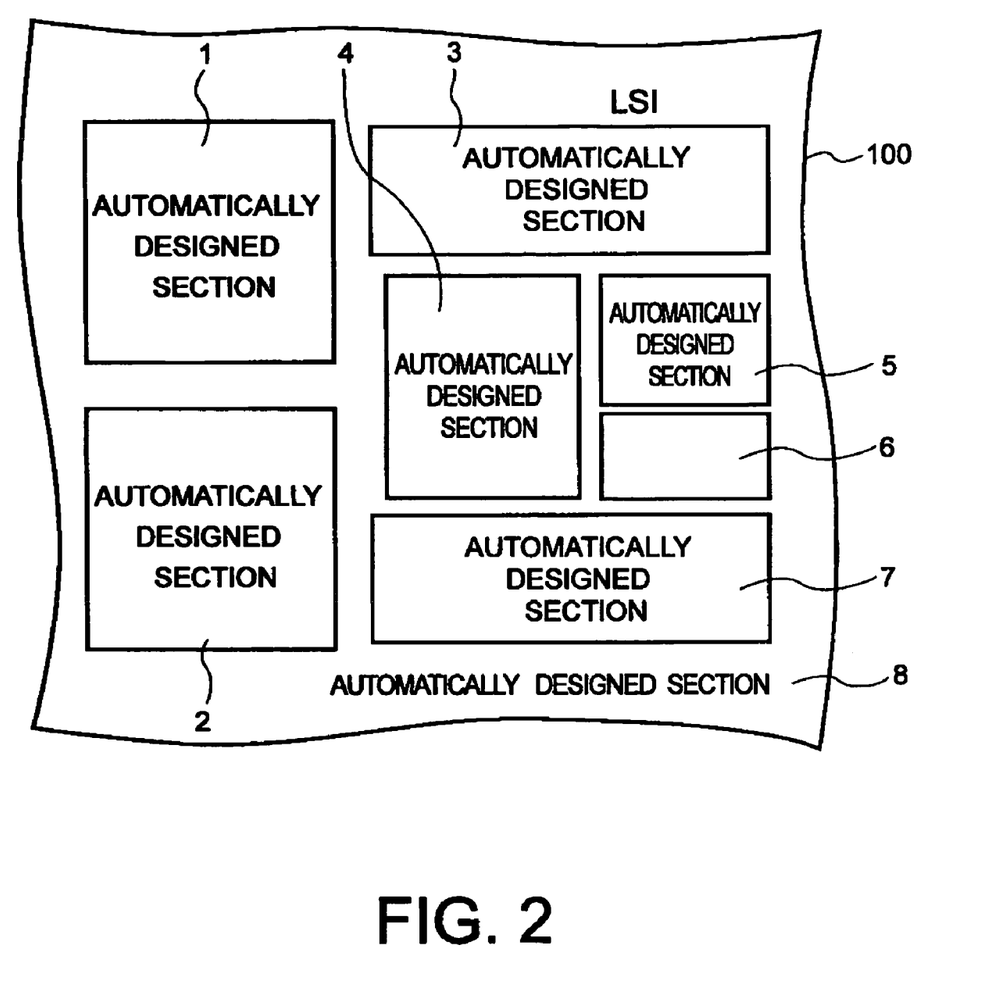
FIG. 2 is a block diagram of an LSI in accordance with the embodiment of the present invention.
Figure 3:
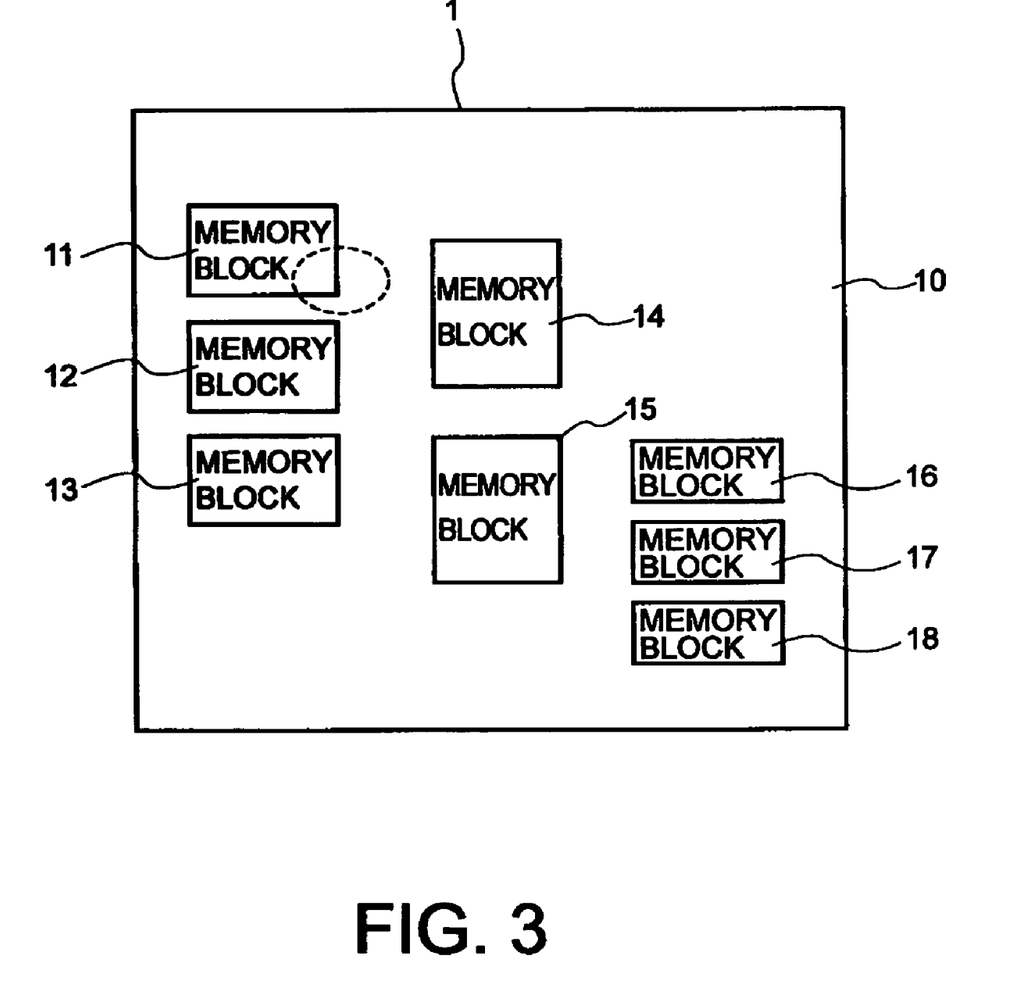
FIG. 3 is a block diagram of a part of automatically designed sections in accordance with the embodiment of the present invention.

As shown in FIG. 1, LSI device 100 is provided with automatically designed sections 1-7 designed by using a standard cell system and automatically designed section 8 designed by means of other technique than such a standard cell system and disposed around automatically designed sections 1-7 as shown in FIG. 2, for example. As shown in FIG. 3, automatically designed section 1 is provided with standard cell region 10 and a plurality of memory blocks 11-18 disposed in neighboring standard cell region 10 as shown in FIG. 3, respectively. FIG. 3 shows a schematic arrangement of automatically designed section 1 but a large number (several hundreds) of memory blocks with various sizes are sometimes actually disposed in a large scale logic LSI for a graphic processor or the like. Other automatically designed sections 2-7 than automatically designed section 1 may include memory blocks in the same fashion as automatically designed section 1 or may comprise standard cell regions only. An enlarged plan-view portion surrounded by a doted line of memory block 11 and standard cell region shown in FIG. 3 correspond to the arrangements shown in FIG. 1.

Figure 4:
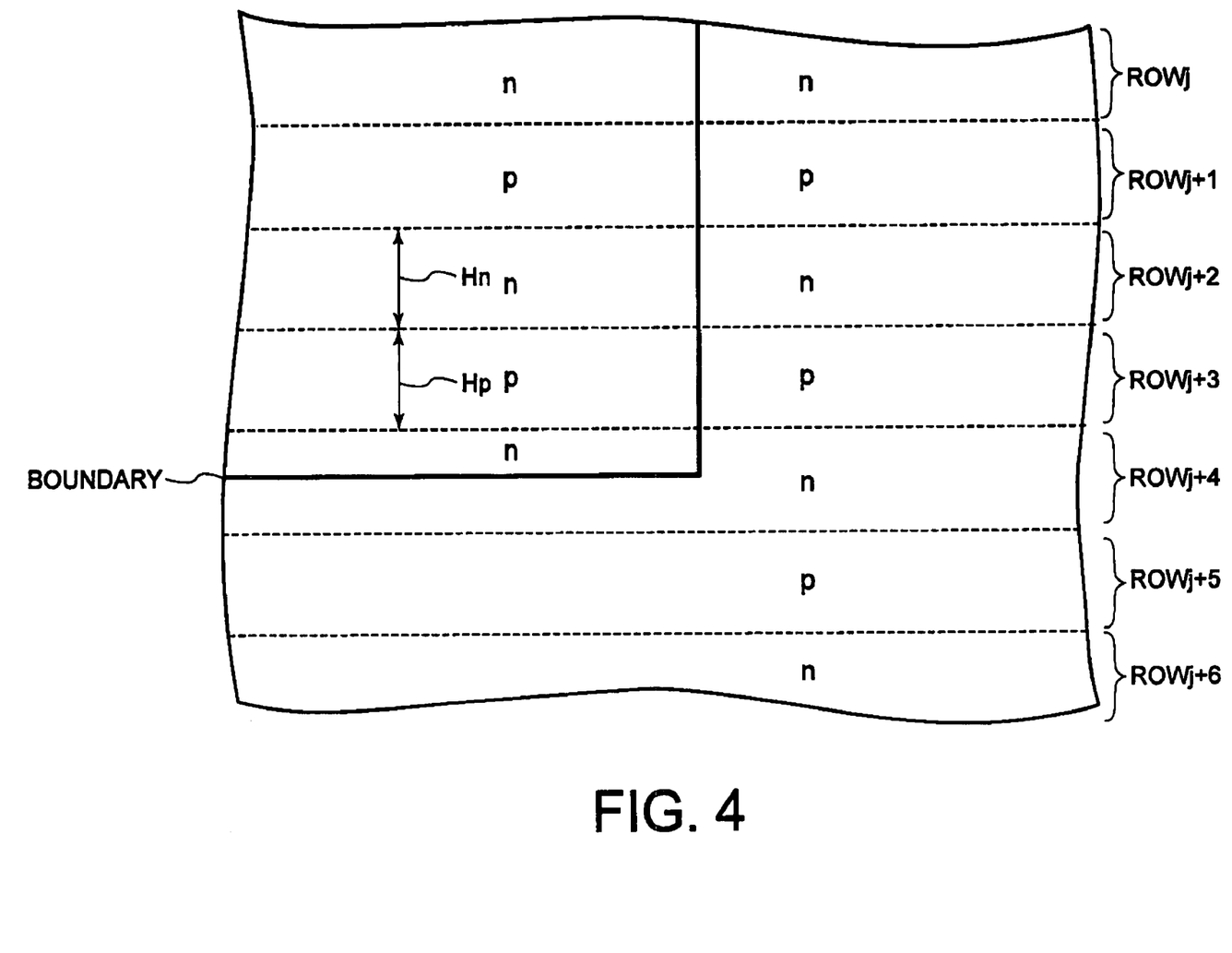
FIG. 4 is a plan view of p-type wells and n-type wells in accordance with the embodiment of the present invention.

Each of standard cells 20 shown in FIG. 1 is a cell of NAND gates, NOT gates (inverters), flip-flop circuits, or the like. Standard cells 20 are laid across p-type wells ROWj+1, ROWj+3, ROWj+5, ... and neighboring n-type wells ROWj+2, ROWj+4, ROWj+6, ..., respectively. P-type wells ROWj+1, ROWj+3, ROWj+5, ... and n-type wells ROWj+2, ROWj+4, ROWj+6, ... are regularly alternately provided to each other in a vertical direction as shown in FIG. 4. Height "Hp" in the vertical direction of each of p-type wells ROWj+1, ROWj+3, ROWj+5, ... is equal to height "Hn" in the vertical direction of each of n-type wells ROWj+2, ROWj+4, ROWj+6, .... In addition, electric power supply lines 51-57 are provided to extend in a horizontal direction on standard cells 20, respectively.

In standard cells 20 shown in FIG. 1, boundary patterns are specified by design rules for boundary positions between p-type wells ROWj+1, ROWj+3, ROWj+5, ... and neighboring n-type wells ROWj+2, ROWj+4, ROWj+6, ..., respectively, electric power supply lines 51-57, distances between the boundary positions, and the like. Since standard cells 20 are disposed in contact with each other, electric power supply lines 51-57 for standard cells 20 are connected to each other and p-type wells ROWj+1, ROWj+3, ROWj+5, ... are connected to neighboring n-type wells ROWj+2, ROWj+4, ROWj+6, ..., respectively.

Figure 5:
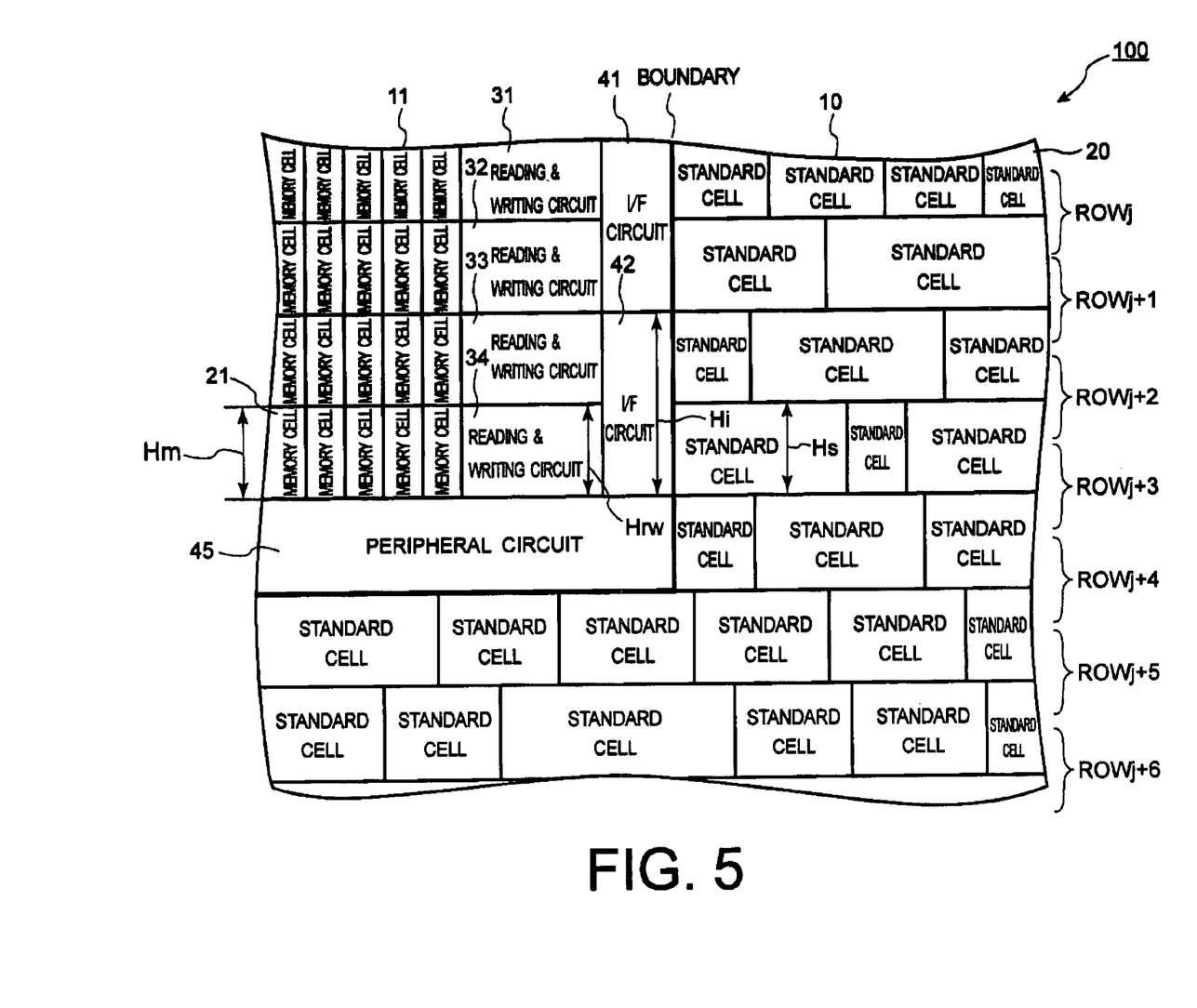
FIG. 5 is a plan view of an LSI in accordance with the embodiment of the present invention.

In memory blocks 11, on the other hand, layout design is carried out based on a pitch of memory cells. As shown in FIGS. 1 and 5, memory block 11 is provided with memory cells 21, reading and writing circuits 31-34 and interface (I/F) circuits 41 and 42 disposed on a boundary side with standard cells 20 as described above. Memory cells 21 are memory elements, such as SRAM cells or the like. Here, height "Hm" of memory cells 21 is equal to the height "Hs" or the height of the standard cells divided by an integer where Hs=n×Hm, (n=integer=1, 2, 3, ... ).In the embodiment, height "Hm" of memory cells shown in FIG. 1 are consistent with those that are "Hs" of standard cells 20, i.e., Hm=Hs and pitches in the vertical direction of memory cells 21 are consistent with those of standard cells 20.

Reading and writing circuits 31-34 read data from memory cells 21 and write data in memory cells 21 as the occasion demands. Height "Hrw" of reading and writing circuits 31-34 are multiple times by integers of those that are "Hm". In the present embodiment, height "Hrw" of reading and writing circuits 31-34 are consistent with those that are "Hm" of memory cells 21, i.e., Hrw=Hm.

I/F circuits 41 and 42 transfer data read from memory cells 21 to standard cells 20 and transfer data transmitted from standard cells 20 to memory cells 21 as the need arises. Height "Hi" of I/F circuits 41 and 42 are two times those that are "Hm" of memory cells 21 or those that are "Hrw" of reading and writing circuits 31-34. In other words, height "Hi" of I/F circuits 41 and 42 are two times those that are "Hs" of standard cells 20. Further, peripheral circuit 45 is disposed in the vicinity of a vertical end portion of memory cells 21. Height "Hp" of peripheral circuit 45 is equal to height "Hm" of memory cells 21.

Here, a boundary position of standard cells 20 neighboring each other in the vertical direction coincides with that of memory cells 21 neighboring each other in the vertical direction. Thus, electric power supply lines 51-54 can be provided to extend linearly in the horizontal direction from memory blocks 11 through standard cell regions 10 on boundaries of standard cells 20 neighboring each other in the vertical direction as well as on those of memory cells 21 neighboring each other in the vertical direction. Electric power supply lines 51-54 can provide standard cells 20 and memory cells 21 with power supply voltage VDD or reference ground voltage GND.

Further, p-type wells ROWj+1, ROWj+3, ROWj+5, ... and n-type wells ROWj+2, ROWj+4, ROWj+6, ... are provided to extend in the horizontal direction from memory blocks 11 through standard cell region 10 as shown in FIGS. 1 and 4. Each element included in standard cells 20 and memory cells 21 is provided in each of p-type wells ROWj+1, ROWj+3, ROWj+5, ... and n-type wells ROWj+2, ROWj+4, ROWj+6, ....

Figure 6:
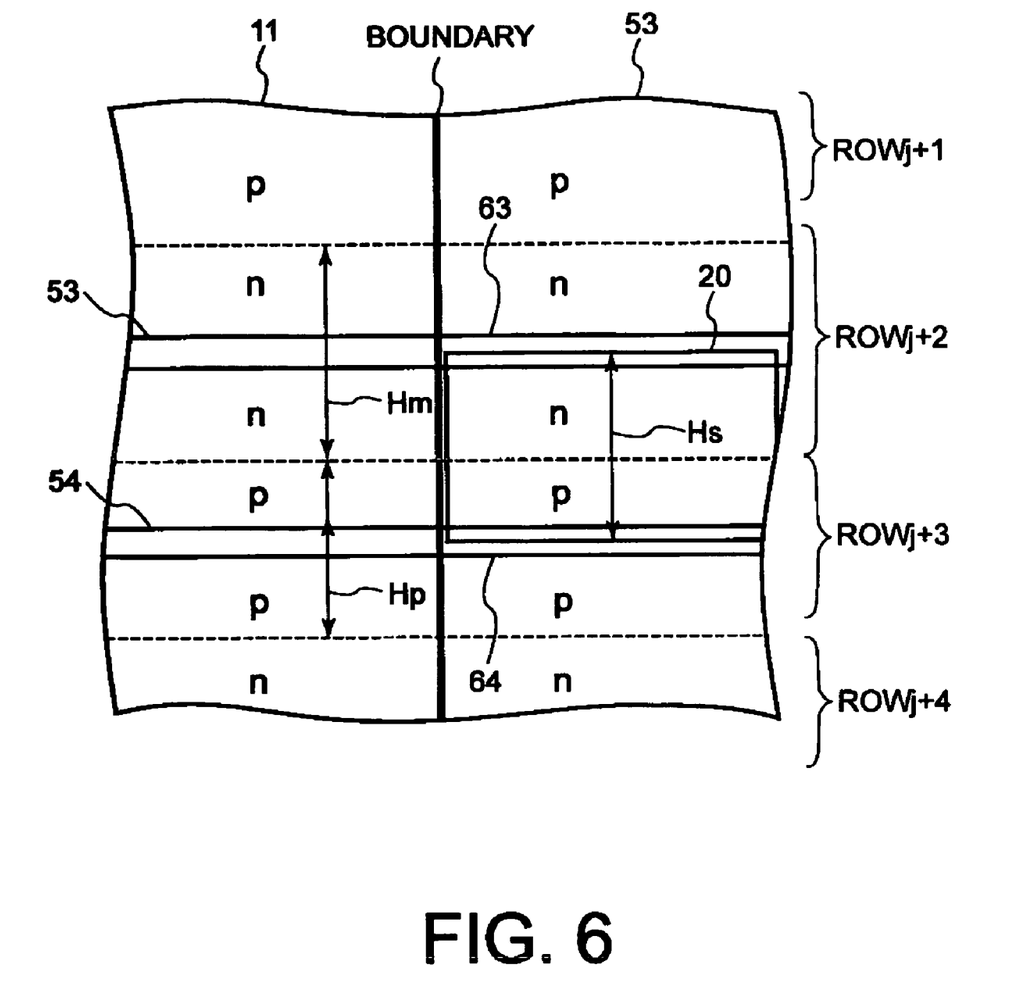
FIG. 6 is a plan view of boundary portions of memory blocks and standard cell regions in accordance with the embodiment of the present invention (an enlarged plan view of a portion surrounded by doted lines shown in FIG. 1).

In this way, electric power supply lines 51-54 commonly provided for memory block 11 and standard cell region 10 and p-type wells ROWj+1, ROWj+3, ROWj+5, ... and n-type wells ROWj+2, ROWj+4, ROWj+6, ... can be used in boundary positions in memory blocks 11 with respect to standard cell region 10 in the horizontal direction. That is, as shown in FIG. 1 and an enlarged layout shown in FIG. 6 of a portion surrounded in doted lines shown in FIG. 1, design rules for standard cells 20 are satisfied with those for memory blocks 11 and standard cell region 10 in the boundary portions of memory blocks 11 and standard cell region 10 in the horizontal direction. Thus, each pattern of memory blocks 11 and standard cell region 10 can be disposed up to the boundary portions between memory blocks 11 and standard cell region 10 so that memory blocks 11 can be provided in contact with standard cell region 10.

Figure 8:
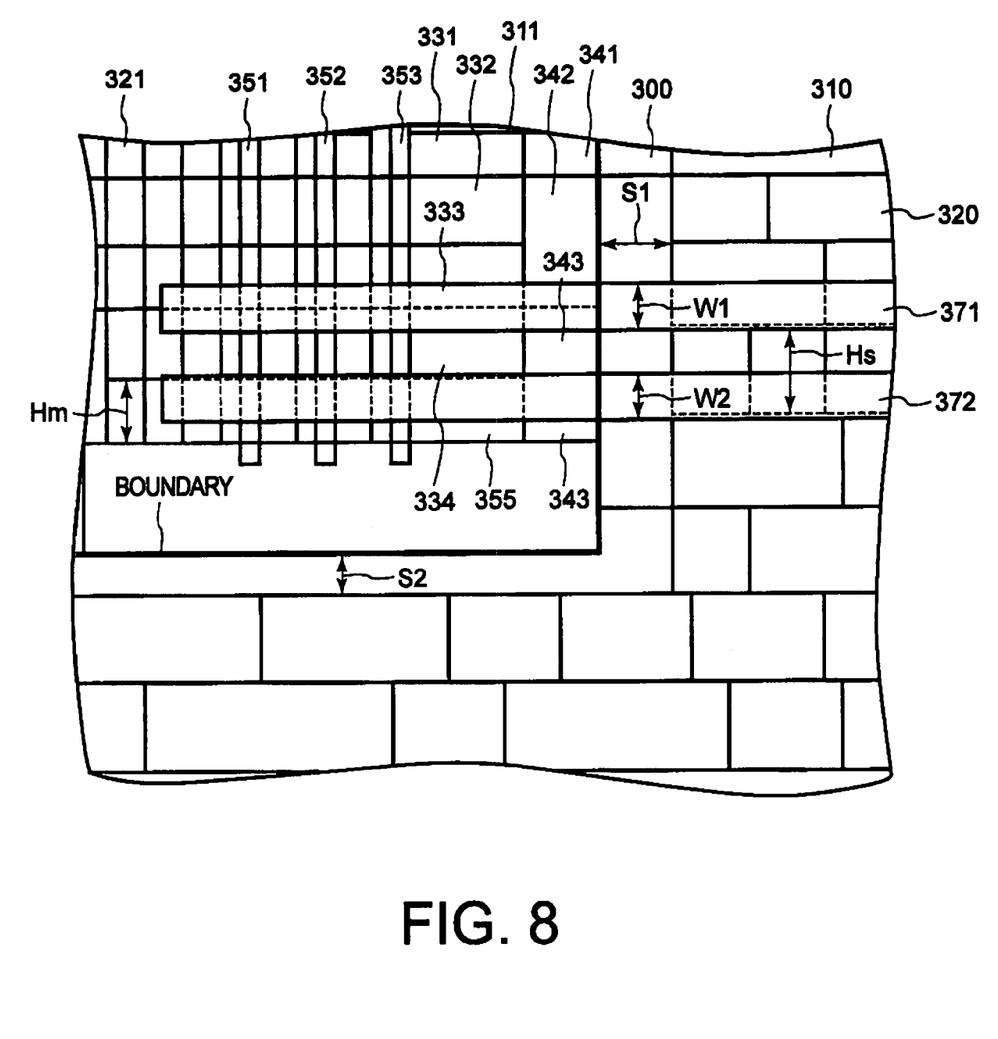
FIG. 8 is a plan view of a comparative example which shows boundary portions between memory blocks and standard cell regions.

A comparative example with LSI device 100 of FIG. 1 is shown in FIG. 8. Layout design in memory block 311 is carried out based on pitches of memory cells 321. Thus, a boundary pattern pitch of memory cells 321 neighbored in the vertical direction is different from that of standard cells 320. In order to avoid design rule conflicts between memory block 311 and standard cell region 310, widths "S1" and "S2" are provided in space region 300 in the horizontal and vertical directions, respectively. As a result, a chip area is increased.

Since LSI device 100 shown in FIG. 1, however, includes memory blocks 11 and standard cells 20 which are provided in contact with memory blocks 11, such an additional space region as shown in FIG. 8 can be removed. In the case that, particularly, a lot of small scale memory blocks 11 are provided, chip areas can be reduced significantly.

Further, memory block 311 shown in FIG. 8 is connected to memory-block-side electric-power-supply lines 351-353 not extending to standard cell region 310 while memory-block-side electric-power-supply lines 351-353 are connected to upper-layer electric-power-supply lines 371 and 372. Upper-layer electric-power-supply lines 371 and 372 require fixed widths W1 and W2, respectively, for supplying enough electric power to memory block 311 from upper-layer electric-power-supply lines 371 and 372 through memory-block-side electric-power-supply lines 351-353. As widths W1 and W2 of upper-layer electric-power-supply lines 371 and 372 become large, the number of signal lines provided on upper-layer electric-power-supply lines 371 and 372 becomes small. Thus, such signal lines are necessarily set at places where upper-layer electric-power-supply lines 371 and 372 do not exist, so that a chip area is increased.

In contrast to that, LSI device 100 shown in FIG. 1 includes electric-power-supply lines 51-54 which can be provided linearly and continuously on the boundaries of memory cells 21 and those of standard cells 20. Since electric-power-supply lines 51-54 supply electric power to memory blocks 11, the widths necessary for upper-layer electric-power-supply lines shown in FIG. 8 can be relatively narrow. Alternatively, when electric power supply lines 51-54 supply sufficient electric-power to memory blocks 11, the upper-layer electric-power-supply lines can be reduced in number or are not required at all as the case may be.

In addition, wells of memory block 311 cannot be connected to those of standard cell region 310 in the comparative LSI device shown in FIG. 8 but the former must be disposed separately from the latter. In LSI device 100 shown in FIG. 1, however, p-type wells ROWj+1, ROWj+3, ROWj+5, ... and n-type wells ROWj+2, ROWj+4, ROWj+6, ... can be provided continuously from memory blocks 11 through standard cell region 10 so that the chip area can be reduced.

Other Embodiments

The present invention is not limited to the embodiment described above with reference to the drawings. Those skilled in the art may make various modifications and/or alternatives without departing from the scope of the invention defined in the attached claims.

Figure 7:
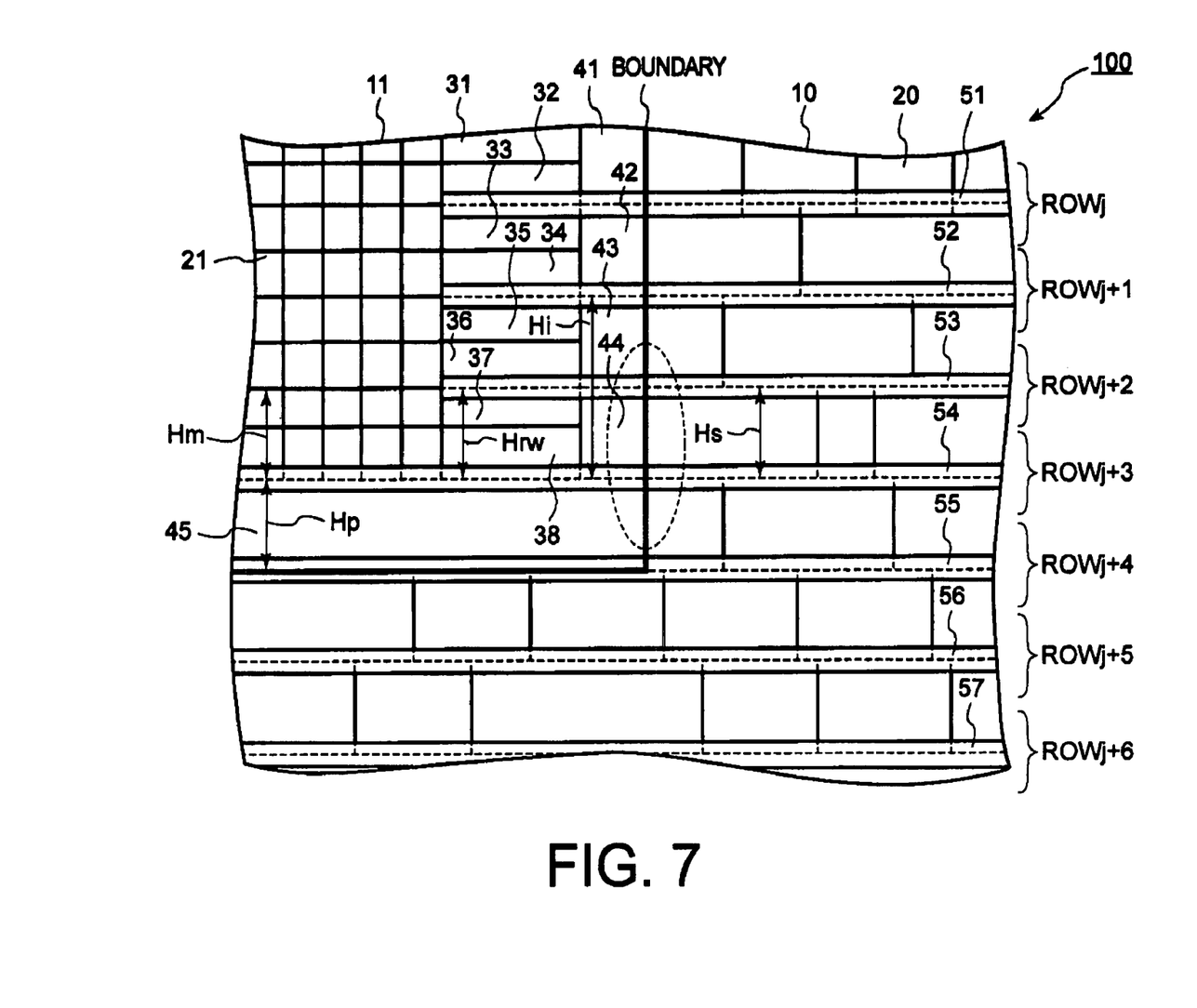
FIG. 7 is a plan view of an LSI in accordance with another embodiment of the present invention.

Height "Hm" of memory cells 21, for example, may be a half, ⅓, ..., or 1/n, (n=integer=1, 2, 3, ...) of those that are "Hs" of standard cells 20. As shown in FIG. 7, height "Hm" of memory cells 21 may be a half of that that "Hs" of standard cell 20, for example. In this case, height "Hrw" of reading and writing circuits 31-38 is equal to height "Hm" of memory cells 21 while height "Hi" of I/F circuits 41-44 is twice height "Hrw" of reading and writing circuits 31-38. In the LSI device shown in FIG. 7, when height "Hm" of memory cells 21 is multiple times by integers of height "Hs" of standard cells 20, the boundary positions of standard cells neighboring each other in the vertical direction are consistent with those of memory cells 21 neighboring each other in the vertical direction, so that memory blocks 11 and standard cell region 10 can be disposed in the vicinity of each other.

As described above, the present invention includes various other embodiments not described in detail as a matter of course. Thus, the reasonable scope of the invention should be determined in accordance with the claims.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. A semiconductor integrated circuit device comprising:
   a standard cell region;
   a plurality of standard cells having an equal height, the standard cells being disposed in the standard cell region in a first direction;
   a memory block neighboring in a second direction with the standard cell region, the second direction being perpendicular to the first direction; and
   a plurality of memory cells having a height which is equal to the height of the standard cells or which is the height of the standard cells divided by an integer, the memory cells being disposed in the memory block in the first direction, wherein boundary positions of the standard cells neighboring each other are consistent with those of the memory cells neighboring each other.

2. A semiconductor integrated circuit device according to claim 1, further comprising electric-power-supply lines provided on boundaries of the standard cells neighboring each other and those of the memory cells neighboring each other, the electric-power-supply lines extending from the memory block to the standard cell region in the second direction.

3. A semiconductor integrated circuit device according to claim 2, further comprising a plurality of p-type wells and a plurality of n-type wells extending from the memory block to the standard cell region in the second direction, wherein the memory blocks and the standard cells are disposed in alternating order in the first direction.

4. A semiconductor integrated circuit device according to claim 3, further comprising interface circuits having a height which is multiple times by integers of the height of the memory cells, wherein the memory blocks are disposed between the memory cells and the standard cell regions.

5. A semiconductor integrated circuit device according to claim 2, further comprising interface circuits having a height which is multiple times by integers of the height of the memory cells, wherein the memory blocks are disposed between the memory cells and the standard cell regions.

6. A semiconductor integrated circuit device according to claim 1, further comprising a plurality of p-type wells and a plurality of n-type wells extending from the memory block to the standard cell region in the second direction, wherein the memory blocks and the standard cells are disposed in alternating order in the first direction.

7. A semiconductor integrated circuit device according to claim 6, further comprising interface circuits having a height which is multiple times by integers of the height of the memory cells, wherein the memory blocks are disposed between the memory cells and the standard cell regions.

8. A semiconductor integrated circuit device according to claim 1, further comprising interface circuits having a height which is multiple times by integers of the height of the memory cells, wherein the memory blocks are disposed between the memory cells and the standard cell regions.

9. A semiconductor integrated circuit device according to one of claims 1-4, wherein the memory block is composed of SRAM devices, sizes of which are different from each other.

* * * * *